(12) United States Patent
Hirakata et al.

(10) Patent No.: US 9,171,955 B2
(45) Date of Patent: Oct. 27, 2015

(54) THIN FILM TRANSISTOR AND MANUFACTURING METHOD THEREOF

(71) Applicant: Semiconductor Energy Laboratory Co., Ltd., Atsugi-shi, Kanagawa-ken (JP)

(72) Inventors: Yoshiharu Hirakata, Atsugi (JP); Yukie Nemoto, Atsugi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 97 days.

(21) Appl. No.: 13/795,526

(22) Filed: Mar. 12, 2013

(65) Prior Publication Data

US 2013/0200372 A1    Aug. 8, 2013

Related U.S. Application Data

(62) Division of application No. 13/336,292, filed on Dec. 23, 2011, now Pat. No. 8,399,887, which is a division of application No. 13/081,525, filed on Apr. 7, 2011, now Pat. No. 8,088,655, which is a division of (Continued)

(30) Foreign Application Priority Data

Mar. 19, 2003    (JP) ................... 2003-076640

(51) Int. Cl.
*H01L 29/04* (2006.01)
*H01L 29/786* (2006.01)
(Continued)

(52) U.S. Cl.
CPC .......... *H01L 29/786* (2013.01); *H01L 27/1214*
(2013.01); *H01L 29/41733* (2013.01); *H01L 29/42384* (2013.01); *H01L 29/66742* (2013.01);
(Continued)

(58) Field of Classification Search
CPC ................. H01L 29/42384; H01L 29/78696; H01L 29/41733
USPC ............................... 257/49, 70, 66
See application file for complete search history.

(56) References Cited

U.S. PATENT DOCUMENTS 4,547,789 A    10/1985  Cannella et al.
4,924,279 A    5/1990   Shimbo (Continued)

FOREIGN PATENT DOCUMENTS

JP    03-291973    12/1991
JP    2000-275678  10/2000

(Continued)

*Primary Examiner* — Douglas Menz
(74) *Attorney, Agent, or Firm* — Eric J. Robinson; Robinson Intellectual Property Law Office, P.C.

(57) ABSTRACT

The present invention provides a structure of the TFT in which a current-voltage characteristic can be improved. The present invention refers to a thin film transistor comprising a lamination layer wherein a first conductive film, a first insulating film and a second conductive film are sequentially laminated, a semiconductor film formed so as to be in contact with the side surface of the lamination layer, and a third conductive film covering the semiconductor film through a second insulating film. The first conductive film and the second conductive film are a source electrode and a drain electrode, and a region which is in contact with the first insulating film and the third conductive film is a channel forming region in semiconductor film, and the third conductive film is a gate electrode.

22 Claims, 12 Drawing Sheets

Related U.S. Application Data application No. 12/000,593, filed on Dec. 14, 2007, now Pat. No. 7,923,780, which is a division of application No. 10/803,092, filed on Mar. 18, 2004, now Pat. No. 7,314,784.

(51) Int. Cl.
*H01L 27/12* (2006.01)
*H01L 29/417* (2006.01)
*H01L 29/423* (2006.01)
*H01L 29/66* (2006.01)

(52) U.S. Cl.
CPC .... *H01L 29/78642* (2013.01); *H01L 29/78696* (2013.01)

(56) References Cited

U.S. PATENT DOCUMENTS

| | | |
|---|---|---|
| 4,949,141 A | 8/1990 | Busta |
| 7,138,682 B2 | 11/2006 | Kamata et al. |
| 2004/0029310 A1 | 2/2004 | Bernds et al. |

FOREIGN PATENT DOCUMENTS

| | | |
|---|---|---|
| JP | 2001-326356 | 11/2001 |
| JP | 2002-057329 A | 2/2002 |
| JP | 2003-318407 | 11/2003 |
| JP | 2004-507096 | 3/2004 |

-Prior Art-

THIN FILM TRANSISTOR AND MANUFACTURING METHOD THEREOF

BACKGROUND OF THE INVENTION

1. Field of the Invention

The present invention relates to an effective technique for a method for manufacturing a thin film transistor (TFT) formed by laminating a semiconductor film and an insulating film over a substrate having an insulating surface. In addition, the present invention relates to an effective technique for a method for manufacturing a thin film transistor having a short-channel structure.

2. Description of the Related Art

In late years, a TFT has been formed by means of a semiconductor thin film (thickness of around several to several hundreds) formed over a substrate having an insulating surface, and development of a semiconductor device having a large area integrated circuit comprising this TFT has been advanced. An active matrix liquid crystal display device, an EL display device, and a contact type image sensor are known as the representative example. Besides, a system on panel provided with a CPU, a DRAM, an image processing circuit, a speech processing circuit in addition to a pixel portion and a drive circuit portion on the same substrate is proposed. In particular, because field-effect mobility is high in a TFT using a crystalline silicon film as an active region, a circuit comprising various functions (for example, a pixel circuit for displaying an image, drive circuits such as a shift register circuit, a level shifter circuit, a buffer circuit, a sampling circuit for controlling the pixel circuits, a CPU, a SRAM, an image processing circuit, and a speech processing circuit, can be formed by using the TFT.

FIG. 10 shows a current-voltage characteristic ($I_d$-$V_d$ characteristic) of a TFT. In addition, a graph of the current-voltage characteristic of the TFT as shown in FIG. 10 shows a current magnitude $I_d$ flowing to a drain region of the TFT to $V_d$ which is a voltage between a source region and a drain region. FIG. 10 is a plurality of graphs showing various value of $V_g$ that is a voltage between a source region and a drain region of the TFT.

As shown in FIG. 10, the current-voltage characteristic of the TFT is divided into two regions by value of $V_g$ and $V_d$. The region of $|V_g-V_{th}|<|V_d|$ shows a saturation region, and the region of $|V_g-V_{th}|>|V_d|$ shows a linear region.

The following formula 1 holds in a saturation region.

$$I_d = \frac{W}{2L}\mu C_{OX}(V_g - V_{th})^2 \quad \text{[Formula 1]}$$

In addition, $\mu$ means mobility of the TFT, $C_{ox}$ means capacitance of a gate insulating film per a unit area, and W/L means a ratio of a channel-width W and a channel-length L in a channel forming region.

On the other hand, the following formula 2 holds in the linear region.

$$I_d = \mu C_{OX} \frac{W}{L}\left\{(V_g - V_{th})V_d - \frac{V_d^2}{2}\right\} \quad \text{[Formula 2]}$$

According to the formula 2, it can be thought that performance of the TFT in the linear region can be improved by means of the gate capacitance ($C_{ox}$) and the ratio of the channel-width and the channel-length (W/L).

To make the capacitance ($C_{ox}$) of the gate insulating film increased is conceivable as the first remedy. Specifically, there are techniques such as raising relative permittivity of the gate insulating film, making the film thickness thin, improving interfacial quality of a semiconductor layer and a gate insulating film, and the like (for example, Reference 1, Japanese Patent Laid-Open No. 2000-275678)

To make the ratio of the channel-width and the channel-length (W/L) further enlarged is conceivable as the second remedy. In other words, the channel width (W) of the TFT is to be magnified or the channel-length (L) is to be reduced.

SUMMARY OF THE INVENTION

However, there is a problem that an area of the TFT becomes larger when the channel width (W) is enlarged for making the W/L ratio increase. When the TFT is used as a switching element of the pixel in the transmissive display device, there is at least a TFT in the pixel which serves as a display portion. Accordingly, when the area of the TFT becomes larger, a display area of a pixel portion becomes narrow, and there is a problem that an aperture ratio of display device is reduced.

In addition, when the area of the TFT becomes larger, the area of the semiconductor layer covered with the gate electrode of the TFT is increased. Therefore, there are problems that parasitic capacitance occurs between the semiconductor film and the gate electrode, and operating frequency is dropped, as a consequence, high speed action is not possible.

Besides, when the area of the TFT becomes larger, an area of a circuit using the TFT is increased, and volume of electronic apparatus having the circuit is increased. As a result, a miniaturized and thin electronic apparatus can not be realized.

On the other hand, there are techniques to narrow the channel-length, that is to say, a technique to narrow the length of the gate electrode to increase a W/L ratio. As for this technique, there are limitations to narrow the channel-length by the following problem: a limitation of miniaturization in exposure equipment used to form a resist mask; a limitation of position alignment precision of a metal mask used to form a resist mask; a limitation to suppress a difference in dimension of the metal mask and finished dimension of the resist mask; and a limitation to suppress a gap by the resist mask and real etching (whether narrow spacing can be surely etched).

Thus, the present invention provides a step in which a channel-length of a TFT be controlled with higher reproducibility. In addition, the present invention provides a step in which a short channel-length of the TFT can be manufactured. Further, the present invention provides a structure of the TFT in which a current-voltage characteristic can be improved.

In addition, the present invention provides structures of a TFT with a small seizure area, a semiconductor integrated circuit having the TFT, and a display device including the TFT and which can improve an aperture ratio.

The present invention relates to a thin film transistor comprising a lamination layer which is formed by laminating a first conductive film, a first insulating film, and a second conductive film in sequence on an insulating surface, a semiconductor film which is formed so as to be in contact with side surfaces of the lamination layer, and a third conductive film for covering the semiconductor film through a second insulating film. The first conductive film and the second conductive film are a source electrode and a drain electrode, respectively, a part being in contact with the first insulating film and the third conductive film in the semiconductor film is a channel forming region, and the third conductive film is a gate electrode.

The second insulating film is a gate insulating film. The gate electrode covers at least a semiconductor film. On the other hand, the gate electrode may cover a part of the semiconductor film which is in contact with the first insulating film.

In addition, the first conductive film, the first insulating film, and the second conductive film are laminated in a lengthwise direction of the insulating surface.

The present invention relates to a thin film transistor comprising a lamination layer which is formed by laminating a conductive film and an insulating film alternately on an insulating surface, a semiconductor film formed on side surfaces of the lamination layer, and a second conductive film covering the semiconductor film through a second insulating film. In the conductive films of the lamination layer, a conductive film which is in contact with an insulating surface and a conductive film which is most away from the conductive film are a source electrode and a drain electrode, respectively. In the semiconductor film, a part which is in contact with the insulating film of the lamination layer and the conductive film of the lamination layer, and the second conductive film is a channel forming region. Further, the second conductive film is a gate electrode.

The gate electrode covers at least the semiconductor film through the insulating film. On the other hand, the gate electrode may cover a part of the semiconductor film through the insulating film. The semiconductor film is in contact with the insulating film and the conductive film of the lamination layer.

In addition, the conductive film and insulating film of the lamination layer are formed alternately in a lengthwise direction of the insulating surface.

The thin film transistor of the present invention can control the channel-length by the film thickness of the insulating film being in contact with the semiconductor film. Accordingly, conventional problems in process for manufacturing the TFT with a short-channel structure can be solved. And it becomes easier to manufacture the TFT with the short-channel structure.

In addition, it is preferable for at least a part of the side surface of the lamination layer to be slanted to the insulating surface. According to this structure, the semiconductor film is formed with higher coatability, and the semiconductor film is prevented from being cut.

In addition, the channel forming region of the semiconductor film may be an closed contour shape. In this case, the W/L ratio can be increased since it is able to widen the channel-width (W). In other words, a current-voltage characteristic of the TFT can be improved.

In addition, when the gate electrode covers a part of the semiconductor film through the insulating film, an area of the TFT can be reduced. Therefore, when this TFT is used in a transmissive display device, an aperture ratio can be improved.

When the second conductive film and the second insulating film are etched, the source electrode or the drain electrode are over-etched for exposing one part thereof. According to this step, the film thickness of the central part of the source electrode or the drain electrode differs from that of the edge portion thereof. By this structure, a contact area of the semiconductor film with the source electrode or the drain electrode is increased, and the contact property can be raised.

According to the present invention, a TFT having an active region can be formed at the side of an insulating film and a pair of conductive films provided through the insulating film. The TFT according to the present invention can control a channel-length by controlling the film thickness of the insulating film sandwiched between the conductive films. Because of this, it becomes easier to manufacture the thin film transistor having the short channel-length because of easily controlling the channel-length in comparison with the conventional step. In other words, because it is easier to increase a W/L ratio, a current-voltage characteristic can be raised and a characteristic of the TFT can be improved.

Since each electrode is overlapped with one another, the area occupied by the TFT can be made small, and further, when the TFT is used in a transmissive display device, an aperture ratio can be raised.

These and other object, features and advantage of the present invention will become more apparent upon reading of the following detailed description along with the accompanied drawings.

DETAILED DESCRIPTION OF THE INVENTION

Hereinafter, the embodiment modes of the present invention are described with reference to the drawings. However, the present invention can be carried out in many different modes. And it is easily understood by those skilled in the art that the mode and the detail of the present invention can be variously changed without departing from the purpose and the scope of the invention. Therefore, the interpretation is not limited to the description of the embodiment modes in the present invention.

For example, in this embodiment modes, a TFT in a pixel portion is explained as a representative example. Because of this, a conductive film which is formed in a contact hole and is connected to a first electrode or a second electrode (a region 111 in FIG. 1, a region 211 in FIG. 2, a region 313 in FIG. 3, a region 411 in FIG. 4, a region 1111 in FIG. 11, a region 1211 in FIG. 12) is described as a pixel electrode. It is not limited to this description, and the pixel electrode can be construed as a wiring.

In addition, as a representative example in each embodiment mode, a side surface of a lamination layer comprising a first conductive film, a second insulating film, and a second conductive film, namely, a region where a semiconductor film is formed has a structure including inclination to the insulating surface, but the structure is not limited to this. The side surface of the lamination layer may be perpendicular to the insulating surface. In this case, the first conductive film, the second insulating film, and the second conductive film can be etched by one mask, therefore, the number of the masks can be reduced.

Embodiment Mode 1

Figure 1A:
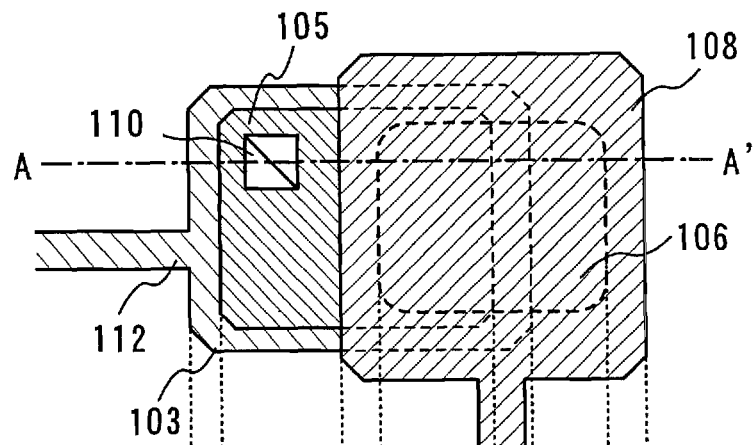
FIGS. 1A and 1B are schematic diagrams of a structure of a TFT of the present invention.
Figure 1B:
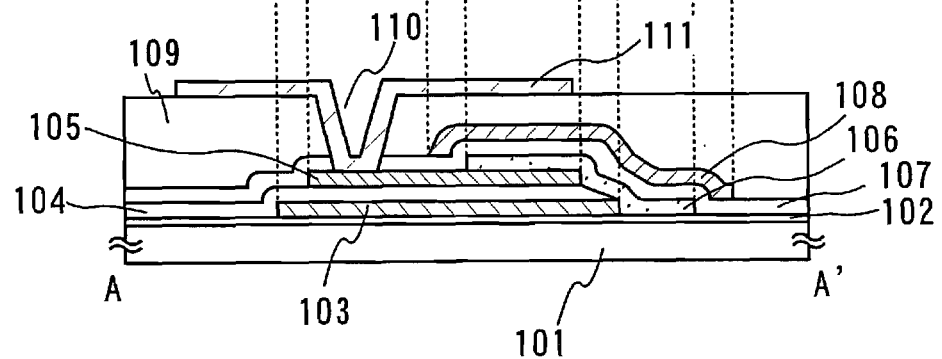

This embodiment mode is described with reference to FIGS. 1A and 1B. FIG. 1A is a top view of a TFT manufactured according to this embodiment mode, and FIG. 1B is a cross-sectional view of the TFT manufactured according to this embodiment mode. At first, after forming a first insulating film 102 over a substrate 101, a first conductive film is formed. The first conductive film is etched into a desired shape, and a first electrode 103 is formed. In addition, the first electrode extends from a first connection wiring 112. In this embodiment mode, the first connection wiring is assumed to be a source wiring.

A glass substrate, a quartz substrate, a resin substrate such as plastics, a silicon substrate, a metal substrate or the like can be used for a substrate material. Besides, a thin film or a flexible member may be used as a substrate.

A silicon oxide film, a silicon oxynitride film, a silicon nitride film, an aluminum nitride film, a DLC (diamond like carbon) are noted as the first insulating film. For a method for manufacturing the first insulating film, a known technique such as CVD, sputtering, or vapor deposition can be used. The insulating film serves to prevent impurities which pass through the substrate (metal ion, moisture, oxygen, and the like.) from scattering and penetrating an element formed over an upper part of the substrate. In the case where the quartz substrate is used for the substrate, the insulating film is not required to be formed. In this embodiment mode, the insulating film is formed with a thickness of from 10 nm to 200 nm. In FIGS. 1A and 1B, a base film is one layer, but it may be at least one layer.

A film formed of a material which performs ohmic contact to a semiconductor film to be formed later is used for the first conductive film. Typically, a film formed of a metal such as gold, platinum, chromium, palladium, aluminum, indium, molybdenum, nickel, tungsten, titanium, tantalum and the like, or an alloy thereof is used to form the first conductive film by using CVD, sputtering, vapor deposition, or the like. In addition, a conductive paste using a material of the metal or the alloy, a conductive polymer film (typically, poly 3,4-(ethylene dioxythiophene) (PEDOT), ITO and the like may be formed by using printing and roll coating.

Next, a second insulating film 104 and a second conductive film are sequentially formed on the first conductive film. For the second insulating film, a silicon oxide film, a silicon oxynitride film, a silicon nitride film which are formed by a sputtering, CVD, a silicon oxide film (SOG: Spin on Glass), Boro-phosphosilicate Glass (BPSG), Phosphosilicate Glass (PSG), an acrylic resin, a polyimide resin, a polyamide resin, a phenoxy resin, nonaromatic polyfunctional isocyanato, a melamine resin which are formed by application, tantalum oxide, titanium oxide, aluminium oxide, DLC (diamond like carbon) formed which are formed by anodic oxidation can be used.

As is the case with the first conductive film, a film formed of a material which performs ohmic contact to a semiconductor film formed later is used for the second conductive film.

Next, a resist mask is formed on the second conductive film, and the second conductive film and the second insulating film are etched into the desired shape. As a result, the etched second conductive film becomes a second electrode 105. The second insulating film is provided so that a source electrode is not connected to a drain electrode electrically. In this step, it is desirable that a side surface of at least the second insulating film is slanted to the surface of the substrate. According to this structure, the semiconductor film is formed with high coatability, and the semiconductor film is prevented from being cut.

In addition, etching of the second insulating film is finished in the interface at which the surface of the first electrode is exposed. As a result, the etched second conductive film becomes the second electrode.

In addition, a channel-length of the semiconductor film formed later can be controlled by controlling the film thickness of the second insulating film. In this embodiment mode, the second insulating film with a film thickness of from 10 nm to 100 nm is formed.

In addition, in this embodiment mode, after the second insulating film and the second conductive film are formed sequentially, the second conductive film and the second insulating film are etched at the same time. However, instead of this step, the second insulating film may be formed and etched, and then, the second conductive film may be formed and etched into the desired shape in order to form the second electrode. In this case, the second conductive film is etched so that one part of the first electrode and the second insulating film is eventually exposed.

In addition, the first electrode or the second electrode can be formed by spraying a solution including electro conductive particles by a drop-wise spraying method represented with ink-jetting, and then by baking for dryness.

Next, a semiconductor film 106 is formed at the side surface of the lamination layer comprising the first electrode, the etched second insulating film and the second electrode. The semiconductor film can be formed of a film including an inorganic material or an organic material, or a film including the inorganic material and the organic material.

A representative example of a semiconductor film formed of an inorganic material includes a silicon film formed by CVD or the like, a silicon film added with gallium and the like. In addition, a representative example of a semiconductor film formed of an organic material includes polymer or an oligomer represented by conjugated polymer, for example, polyphenylenevinylene derivative, polyfluorene derivative, polythiophene derivative, polyphenylene derivative and copolymer thereof, oligophenylene, and oligothiophene. And these are formed by a wet method such as spin coating, dip coating, ink-jet print, screen print, spray coating, or the like. Further, pentacene, tetracene, copper phthalocyanine, fluorination phthalocyanine, perylene derivative are given for an example of a low molecular substance, and these are mainly formed by vacuum deposition, however, electrolysis polymerization, or electrolytic deposition may be used, too.

Next, after a third insulating film 107 and a third conductive film are sequentially formed on the entire surface of the substrate, the third conductive film is etched into the desired shape. In the etching step, it is important that a part of the semiconductor film which is at least in contact with the second insulating film 104 is covered with the third conductive film. As a result, the third insulating film is to be a gate insulating film, and the etched third conductive film is to be a gate electrode 108.

As the third insulating film, a silicon oxide film, a silicon oxynitride film, and a silicon nitride film formed by sputtering or CVD, a silicon oxide film formed by thermal oxidation, a silicon oxide film formed by application (SOG: Spin on Glass), Boro-phosphosilicate Glass (BPSG), phosphosilicate Glass (PSG), a material (siloxane) in which a skeleton structure is configured in bond with silicon (Si) and oxygen (O), and which at least includes hydrogen in the substituent, a material (poly silazane) including polymer having Si—N bond, polyvinyl alcohol (PVA), polymethyl methacrylate (PMMA), polystyrene (PS), poly vinylphenol, polyparaxylylene and the derivative, polyimide and the derivative, polyacrylonitrile, polymethyl methacrylate, polystyrene, poly phenol derivative, polyurea, polyethylene, polypropylene, polyvinyl chloride, polyvinylidene chloride, polyvinyl fluoride, polyvinylidene fluoride, polymer film such as cellulose acetate or the derivative, DLC (diamond like carbon) and the like can be used. In this embodiment mode, the third insulating film with a film thickness of from 50 nm to 130 nm is layered.

As the third conductive film, poly (3,4-ethylenedioxythiophene) (PEDOT) which is formed by ink-jetting, an element chosen from Ta, W, Ti, Mo, Al, Cu formed by a known technique such as CVD, sputtering, vapor deposition, or the like, a film formed of a alloy material or a compound material in which the aforementioned elements are in the main components, or a semiconductor film represented by a polycrystalline silicon film doped with an impurity element such as phosphorus can be used.

Next, a fourth insulating film 109 is formed on the entire surface of the substrate. For the fourth insulating film, an inorganic insulating film (typically, a silicon oxide film, a silicon nitride film, and a silicon oxynitride film), and an organic insulating film (typically, polyimide, acryl, polyamide, polyimidamide, BCB (benzo cyclobutene)) can be used. In the case of using the inorganic insulating film as the fourth insulating film, it is desirable that the surface is planarized by polishing steps or the like.

Next, a contact hole 110 is formed in the fourth insulating film, and a wiring 111 (second connection wiring) connecting with the second electrode are formed. In this embodiment mode, the second connection wiring is to be a pixel electrode.

By the above-mentioned step, a TFT having an active region at the side of the insulating film and a pair of conductive films provided through the insulating film can be formed. It is easier that the TFT manufactured according to this embodiment mode controls the channel-length by controlling the film thickness of the second insulating film. Because of this, a thin film transistor having a shorter channel-length can be manufactured in comparison with a conventional step since it becomes easier to control the channel-length. In other words, because it becomes easier to increase a W/L ratio, a current-voltage characteristic can be raised and the characteristic of the TFT can be improved.

Besides, because the first electrode and the second electrode are overlapped with each other, the area occupied by the TFT can be reduced. When the TFT is used in the transmissive display device, an aperture ratio can be raised.

Embodiment Mode 2

Figure 2A:
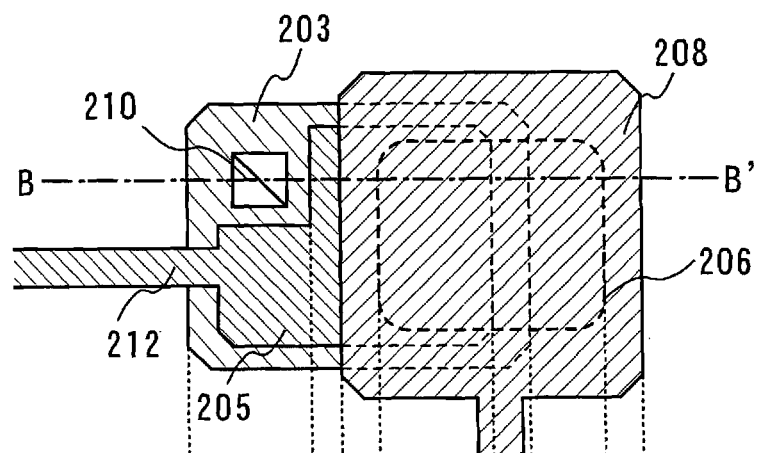
FIGS. 2A and 2B are schematic diagrams of a structure of a TFT of the present invention.
Figure 2B:
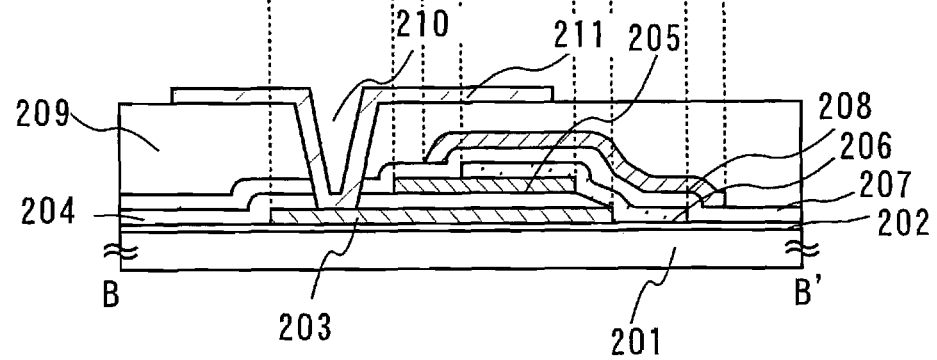

In this embodiment mode, a structure in which a second electrode extends from a first connection wiring in Embodiment Mode 1 is described with reference to FIGS. 2A and 2B. In addition, FIG. 2A is a top view of a TFT manufactured according to this embodiment mode, and FIG. 2B is a cross-sectional view of the TFT.

At first, after a first insulating film 202 is formed on a substrate 201, a first conductive film is formed. The first conductive film is etched into the desired shape to form a first electrode 203. The first electrode is connected to a second connection wiring 211 in the following step. In this embodiment mode, the second connection wiring serves as a pixel electrode. The first insulating film and the first conductive film can be formed of the same material and the same method as those in Embodiment Mode 1.

Next, a second insulating film 204 and a second conductive film are sequentially formed on the first electrode. The second insulating film and the second conductive film can be formed of the same material and the same method as those in Embodiment Mode 1.

Next, a resist mask is formed on the second conductive film. The second conductive film and the second insulating film are etched into the desired shape, and a second electrode 205 is formed. At the same time, each the second insulating film 204 and the first electrode 203 is exposed partly. The same technique as that in Embodiment Mode 1 can be used in this step. In addition, in this embodiment mode, the second conductive film is etched so that the first electrode 203 and the second connection wiring are connected. That is to say, the second conductive film is etched so that the first electrode includes at least a region which is not covered with the second electrode. In addition, the second electrode 205 extends from a first connection wiring 212. In this embodiment mode, the first connection wiring is to be a source wiring.

Next, a semiconductor film 206 is formed at the side surface of a lamination layer comprising the first electrode, the etched second insulating film and the second electrode. The semiconductor film can be formed of the same material as that in Embodiment Mode 1.

Next, after a third insulating film 207 and a third conductive film are sequentially formed on the entire surface of the substrate, the third conductive film is etched into the desired shape in order to form a gate electrode. In the etching step, it is important that the third conductive film covers a part of the semiconductor film at least connecting to the second insulating film. As a result, the third insulating film 207 becomes a gate insulating film, and the etched third conductive film becomes a gate electrode 208.

Next, a fourth insulating film 209 is formed on the entire surface of the substrate. The third insulating film, the third conductive film and a fourth insulating film can be formed of the same material as that in Embodiment Mode 1.

Next, a contact hole 210 is formed in the fourth insulating film, and a wiring (second connection wiring) 211 connecting with the first electrode is formed. In this embodiment mode, the second connection wiring serves as the pixel electrode.

By the above-mentioned step, a TFT having an active region at the side surface of the insulating film and the a pair of films provided through the insulating film can be formed. The channel-length of the TFT manufactured according to this embodiment mode can be easily controlled by controlling the film thickness of the second insulating film. Because of this, a thin film transistor having a shorter channel-length than that in the conventional step can be manufactured because it becomes easier to control the channel-length in comparison with a conventional step. In other words, it becomes easier to increase a W/L ratio, a current-voltage characteristic can be raised, and the characteristic of the TFT can be improved.

Besides, since the first electrode and the second electrode are overlapped with each other, the area occupied by the TFT can be reduced. When the TFT is used in a transmissive display device, an aperture ratio can be raised.

Embodiment Mode 3

Figure 3A:
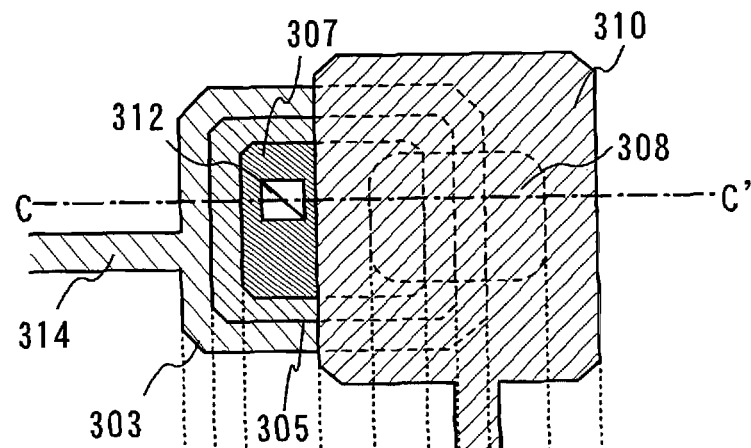
FIGS. 3A and 3B are schematic diagrams of a structure of a TFT of the present invention.
Figure 3B:
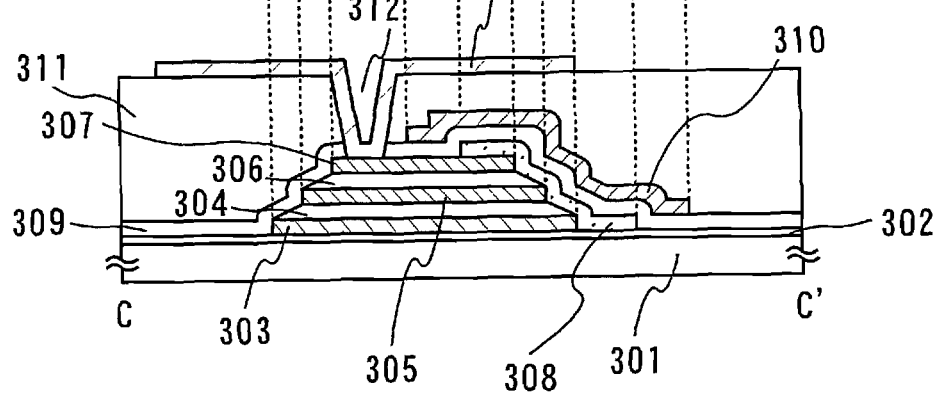

In this embodiment mode, a method for manufacturing a TFT having a plurality of channel forming regions is described with reference to FIGS. 3A and 3B. FIG. 3A is a top view of a TFT manufactured according this embodiment mode, and FIG. 3B is a cross-sectional view of the TFT. A connection method of a first connection wiring, a second connection wiring, a first electrode and a second electrode is the same as that in Embodiment Mode 1.

Firstly, after a first insulating film 302 is formed on a substrate 301 as is the case with Embodiment Mode 1, a first conductive film is formed. After this, the first conductive film is etched into the desired shape, and a first electrode 303 is formed. The first electrode extends from a first connection wiring 314. In this embodiment mode, the first connection wiring is to be a source wiring.

Next, a second insulating film, a second conductive film, a third insulating film and a third conductive film are layered on the first electrode sequentially. The second insulating film and the third insulating film can be formed of the same material as that of the second insulating film in Embodiment Mode 1. The second conductive film and the third conductive film can be formed of the same material as that of the first conductive film and the second conductive film in Embodiment Mode 1.

Next, a resist mask is formed on the third conductive film, and the third conductive film, the third insulating film, the second conductive film, and the second insulating film are etched into the desired shape. A second electrode 305 is formed from the second conductive film, and a third electrode 307 is formed from the third conductive film. In addition, etching is performed so that each the first electrode 303 and the second electrode 305 is exposed partly. In addition, the etching step can be adapted to the step of etching the second insulating film and the second conductive film in Embodiment Mode 1. Thus, a lamination layer which is formed by laminating the conductive film and insulating film alternately is formed.

Next, a semiconductor film 308 is formed at the side surface of the lamination layer comprising the first electrode 303, the etched second insulating film 304, the second electrode 305, the etched third insulating film 306 and the third electrode 307. The semiconductor film can be formed of the same material as that in Embodiment Mode 1.

Next, after a fourth insulating film 309 and a fourth conductive film are sequentially formed over the entire surface of the substrate, the fourth conductive film is etched into the desired shape to form a gate electrode 310. In the etching step, it is important that a part of the semiconductor film which is at least connected to the second insulating film 304 and a part of the semiconductor film which is at least connected to the third insulating film 306 are covered with the gate electrode 310. As a result, the fourth insulating film serves as a gate insulating film, Next, a fifth insulating film 311 is formed on the entire surface of the substrate.

Next, a contact hole 312 is formed in the fifth insulating film, and a wiring (second connection wiring) 313 connecting to the second electrode is formed. In this embodiment mode, the second connection wiring serves as a pixel electrode.

In this embodiment mode, an example of a TFT having two channel forming regions is shown, but it is not limited to this. Accordingly, a TFT having an n−1 channel forming region can be manufactured. Specifically, n−1 layered insulating film and an n layered conductive film are alternately laminated, and a TFT wherein a semiconductor film, a gate insulating film, and a gate electrode can be formed at the side surface of the lamination layer can be manufactured.

By the above-mentioned step, a TFT having an active region at the side surface of the lamination layer in which the insulating film and the conductive film are alternately laminated can be formed. By controlling the film thickness of the second insulating film and the third insulating film manufactured according to this Embodiment Mode, the channel-length can be controlled. Since it becomes easier to control the channel-length, a thin film transistor having a short channel-length can be manufactured in comparison with a TFT manufactured in a conventional step. In other words, because it becomes easier to increase a W/L ratio, a current-voltage characteristic can be raised and the characteristic of the TFT can be improved. Because, in an active region, a plurality of channel forming regions are serially-connected and electric field at the interface between a drain region and a channel forming region is relaxed, off-state current can be reduced.

Because the first electrode, the second electrode and the third electrode are overlapped with one another, the area occupied by the TFT can be lowered. In addition, when the TFT is used in transmissive display device, an aperture ratio can be raised.

The present embodiment mode can be applied to the TFT in Embodiment Mode 1 or the TFT in Embodiment Mode 2.

Embodiment Mode 4

Figure 4A:
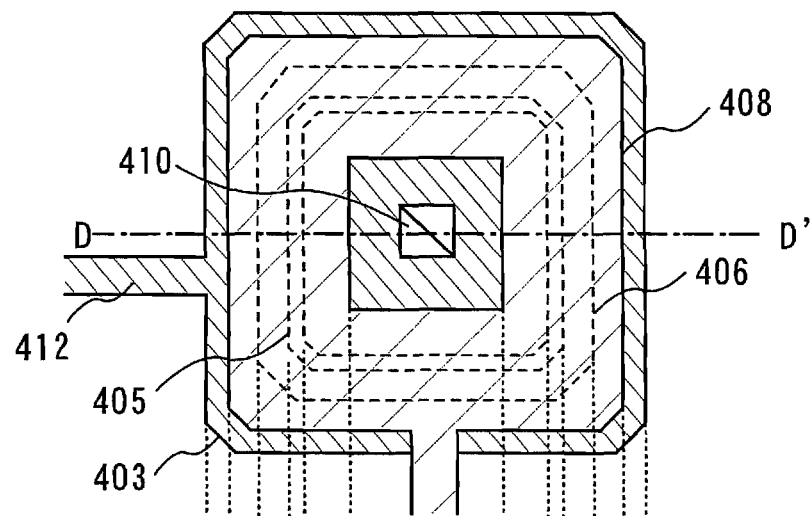
FIGS. 4A and 4B are schematic diagrams of a structure of a TFT of the present invention.
Figure 4B:
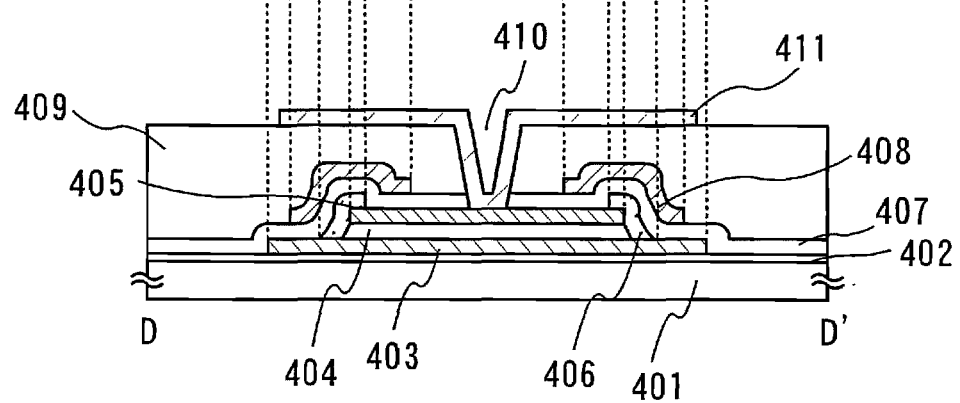

In this embodiment mode, a method for manufacturing a TFT having a channel forming region of closed contour shape is described with reference to FIGS. 4A and 4B. FIG. 4A is a top view of a TFT manufactured according to this embodiment mode, and FIG. 4B is a cross-sectional view thereof. A structure where a first electrode extends from a first connection wiring is described.

Firstly, a first insulating film 402 and a first conductive film are sequentially layered on a substrate 401 as is the case with Embodiment Mode 1. After this, the first conductive film is etched into the desired shape to form a first electrode 403. The first electrode extends from the first connection wiring 412. In this embodiment mode, the first connection wiring is to be a source wiring. The first insulating film and the first conductive film can be formed by using the same material and the same method as those in Embodiment Mode 1.

Next, a second insulating film and a second conductive film are sequentially layered on the first conductive film. The second insulating film and the second conductive film can be formed by using the same material and the same method as those in Embodiment Mode 1.

Next, a resist mask is formed on the conductive film, the second conductive film and the second insulating film are etched into the desired shape in order to form a second electrode 405. In the step, the second conductive film and the second insulating film are etched until a part of the first electrode is exposed. In this embodiment mode, the second insulating film and the second conductive film are preferably etched into the similar shapes. By etching as described, the distance between the first electrode and the second electrode can be kept constant in the part where a semiconductor film is formed later. In other words, a channel forming region having an uniform channel-length (L) and a longer channel width (W) can be formed.

In this embodiment mode, after the second insulating film and the second conductive film are sequentially formed, the second conductive film and the second insulating film are etched at the same time. However, instead of this step, after the second insulating film is formed, and etched, then the second conductive film may be formed and etched into a desired shape in order to form the second electrode. For this case, the second conductive film is etched so that each the first electrode and the second insulating film are finally exposed partly.

Next, a semiconductor film 406 is formed at the side surface of the lamination layer comprising the first electrode, the etched second insulating film 404 and the second electrode 405. The semiconductor film can be formed of the same material as that in Embodiment Mode 1. After this, the central part in the semiconductor film is removed, and a semiconductor film having a closed contour shape seen from the above is formed.

Next, after sequentially forming a third insulating film 407 and a third conductive film on the entire surface of the substrate, the third conductive film is etched into the desired shape, thereby forming a gate electrode 408. In the etching step, it is important that a part of the semiconductor film connecting at least to the second insulating film is covered with the third conductive film. In addition, the third insulating film serves as a gate insulating film.

Next, a fourth insulating film 409 is formed on the entire surface of the substrate. In this embodiment mode, the third insulating film, the third conductive film and the fourth insulating film can be formed of the same material as that in Embodiment Mode 1, respectively.

Next, a contact hole is formed in the fourth insulating film, and a wiring (second connection wiring) 411 connecting to the second electrode is formed. In the step, it is important that the contact hole is formed so as not to be in contact with the semiconductor film 406 and the gate electrode 408. In other words, a contact hole is formed in the region where the third insulating film 407 and the fourth insulating film 409 are sequentially connected to the second electrode 405. In this embodiment mode, the second connection wiring is to be a pixel electrode.

According to the above-mentioned step, a TFT having an active region at the side surfaces of the insulating film and the conductive film which is laminated over the in insulating film can be formed. The channel-length of the TFT manufactured according to this embodiment mode can be controlled by controlling the film thickness of the second insulating film. A thin film transistor having a shorter channel-length than that in a conventional step can be manufactured since it becomes easier to control the channel-length. In other words, because it becomes easier to increase a W/L ratio, a current-voltage characteristic can be raised and the characteristic of the TFT can be improved. A channel forming region of the TFT formed in this embodiment mode has a shape of closed contour, so the channel-length can be shortened, and the channel-width (W) can be increased at the same time. As a result, a current-voltage characteristic can be raised.

Since the first electrode and the second electrode are overlapped with each other, the area occupied by the TFT can be lowered. When the TFT is used in a transmissive display device, an aperture ratio can be raised.

In addition, this embodiment mode can be applied to either of the TFT in Embodiment modes 1 to 3.

Embodiment Mode 5

In this embodiment mode, a structure wherein each a first electrode and a second electrode makes contact areas with a semiconductor film increased and raises the each contact property is described. This embodiment mode is described with reference to the TFT structure in Embodiment Mode 1. A similar symbol is used to the part which refers to the same part, and description of the detail is omitted in the same part. The present embodiment mode can be applied to the TFT in Embodiment Mode 2, Embodiment Mode 4, or Embodiment Mode 6.

Figure 11A:
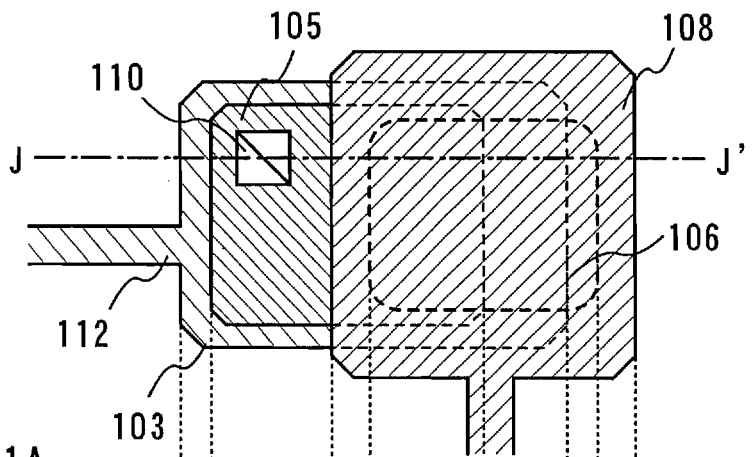
FIGS. 11A to 11C are diagrams showing a manufacturing step of a TFT of the present invention.
Figure 11B:
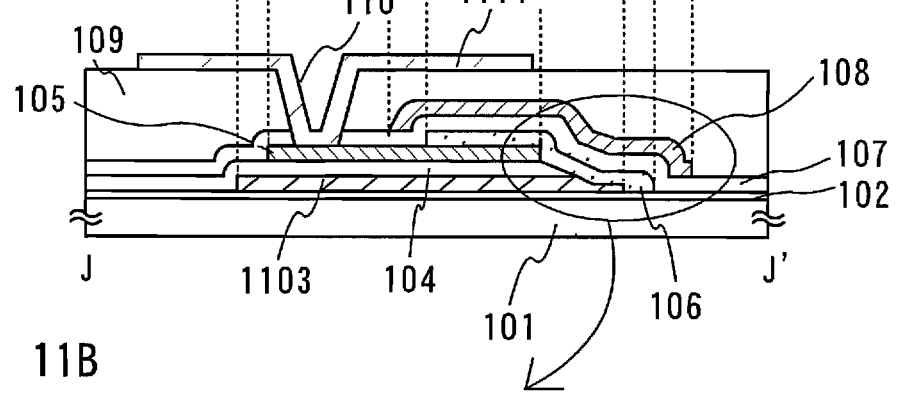
Figure 11C:
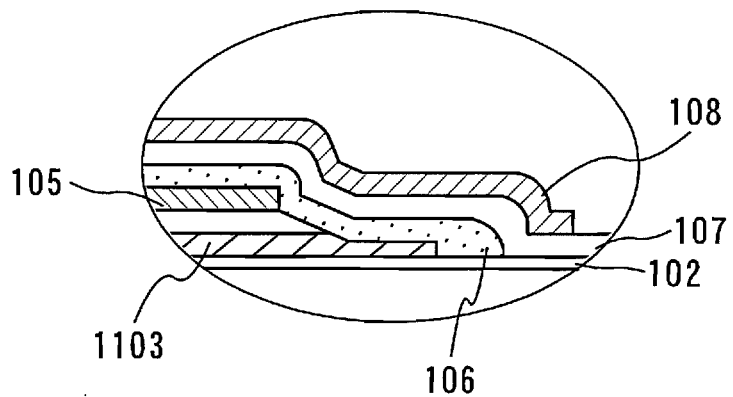

This embodiment mode is described with reference to FIGS. 11A to 11C. FIG. 11A is a top view of the TFT manufactured according to this embodiment mode, FIG. 11B is a cross-sectional view of the TFT, and FIG. 11C is an enlarged view of the first electrode, the second electrode and semiconductor film of the TFT.

Firstly, after a first insulating film 102 is formed on a substrate 101, a first conductive film is formed. Then the first conductive film is etched into a desired shape, thereby forming a first electrode 1103. Incidentally, the first electrode extends from a first connection wiring 112. In this embodiment mode, the first connection wiring is to be a source wiring.

Next, a second insulating film 104 and a second conductive film are sequentially layered on the first conductive film.

Next, a resist mask is formed on the second conductive film, and the second conductive film and the second insulating film 104 are etched into the desired shape. As a result, the etched second conductive film becomes a second electrode 105. The second insulating film is provided so as not to connect a drain electrode to a source electrode electrically.

In addition, after the second conductive film is etched into the desired shape for forming the second electrode 105, the second insulating film may be etched into the desired shape.

Further, in the above mentioned step, a part of the first electrode is over etched as in FIG. 11C so that one part of the first electrode 1103 is exposed. The exposed portion of the first electrode 1103 is increased by taking such a step, the contact areas with the semiconductor film formed later is increased, therefore the contact properties can be raised. In addition, accuracy of the channel-length can be raised.

In addition, the film thickness of the second insulating film becomes approximately equal to the channel-length of the semiconductor film to be formed later. In other words, the channel-length can be controlled by controlling the film thickness of the second insulating film. In this embodiment mode, the second insulating film with a film thickness of 10 nm to 100 nm is formed.

After the second insulating film and the second conductive film are sequentially formed, the second conductive film and the second insulating film are etched at the same time in this embodiment mode, however, instead of this step, the second insulating film may be formed and etched, then the second conductive film may be formed and etched so as to form the second electrode. In this case, the second insulating film and the second conductive film are etched so that a part of the second insulating film is exposed and the first electrode is over etched.

Next, a semiconductor film 106 is formed at the side surfaces of the lamination layer comprising the first electrode, the etched second insulating film and the second electrode. The semiconductor film can be formed with a film including an inorganic material or an organic material, or a film including an organic material and an inorganic material.

Next, after a third insulating film 107 and the a conductive film are sequentially formed on the entire surface of the substrate, the third conductive film is etched into the desired shape. In the etching step, it is important that at least the part of the semiconductor film which is in contact with the second insulating film 104 is covered with the third conductive film. As a result, the third insulating film 107 becomes a gate insulating film, and the etched third conductive film becomes a gate electrode 108.

Next, a fourth insulating film 109 is formed on the entire surface of the substrate. When an inorganic insulating film is used to the fourth insulating film, the surface of the insulating film is preferably planarized by polishing step or the like.

Next, a contact hole 110 is formed in the fourth insulating film, and a wiring 1111 (second connection wiring) connecting with the second electrode is formed. In this embodiment mode, a second connection wiring serves as a pixel electrode.

By the above-mentioned step, a TFT having an active region at the side surfaces of the insulating film and the conductive film laminated over the insulating film can be formed. The TFT which can be manufactured in this embodiment mode can raise a contact property than that in Embodiment Mode 1 since the contact areas with the first electrode and the semiconductor film can be increased as the second electrode. In addition, it is easier to control the channel-length by controlling a film thickness of the second insulating film. Because of this, a thin film transistor having a shorter channel-length than that in a conventional step can be manufactured, since it becomes easier to control the channel-length in comparison with a conventional step. In other words, since it is easier to increase a W/L ratio, a current-voltage characteristic can be raised and the characteristic of the TFT can be improved.

Because the first electrode and the second electrode are overlapped each other, the area occupied by the TFT can be lowered. When the TFT is used in a transmissive display device, an aperture ratio can be raised.

Embodiment Mode 6

In this embodiment mode, a first electrode 1103 of a semiconductor device as shown in embodiment mode 5 is described. Because one part of the first electrode 1103 is over etched as shown in FIG. 11C, the film thickness of the central part differs from that of the edge portion. According to this structure, the contact areas with a semiconductor film formed later is increased, and the contact property can be raised.

Embodiment Mode 7

Figure 12A:
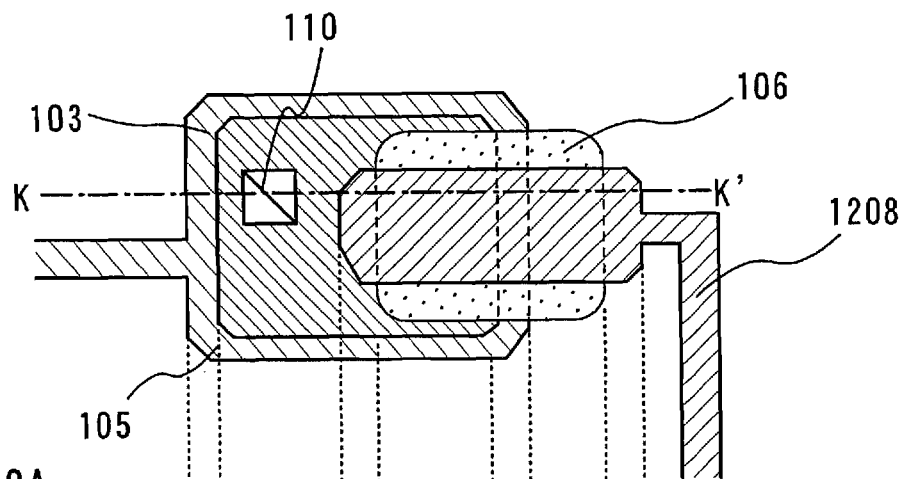
FIGS. 12A and 12B are schematic diagrams of a structure of a TFT of the present invention.
Figure 12B:
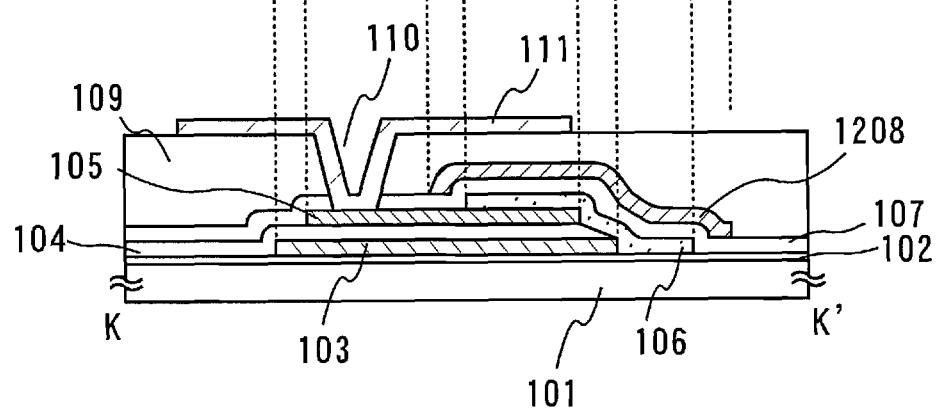

In this embodiment mode, a structure of the TFT in which an area of the TFT can be further reduced is described using FIG. 12. This embodiment mode is described by using a structure of the TFT in Embodiment Mode 1. Accordingly, the same symbol is used to the part which refers to the same, and description of the detail is omitted. In addition, this embodiment mode can be applied to any one of the TFTs in Embodiment Mode 2, Embodiment Mode 3, and Embodiment Mode 5.

According to a step in Embodiment Mode 1, a first insulating film 102, a first electrode 103, a second insulating film 104, a second electrode 105, a semiconductor film 106, and a third insulating film 107 are formed on a substrate.

After this, a third conductive film is formed and etched into the desired shape, thereby forming a gate electrode 1208. In this case, only a part of the semiconductor film formed over a channel forming region is covered with a third conductive film. According to this structure, the area occupied by the gate electrode is reduced. As a result, the aperture ratio of a pixel can be improved, while raising a current-voltage characteristic of the 1141.

Embodiment 1

Hereinafter, an embodiment of the present invention is described. In this embodiment, a method for manufacturing a TFT in an active matrix substrate of a liquid crystal display with the use of the TFT having the structure of Embodiment Mode 1 and particularly, a method for manufacturing a TFT in a pixel portion is described with reference to FIG. 5A to FIG. 9B. In addition, FIG. 5A to FIG. 9A shows a top view of a pixel portion of an active matrix substrate. Because an insulating film is formed over the entire surface, the description is omitted. FIG. 5A to FIG. 9B each shows cross sectional views of A-A' in FIGS. 5A and 5B, B-B' in FIGS. 6A and 6B, C-C' in FIGS. 7A and 7B, D-D' in FIGS. 8A and 8B, E-E in FIGS. 9A and 9B respectively.

Figure 5A:
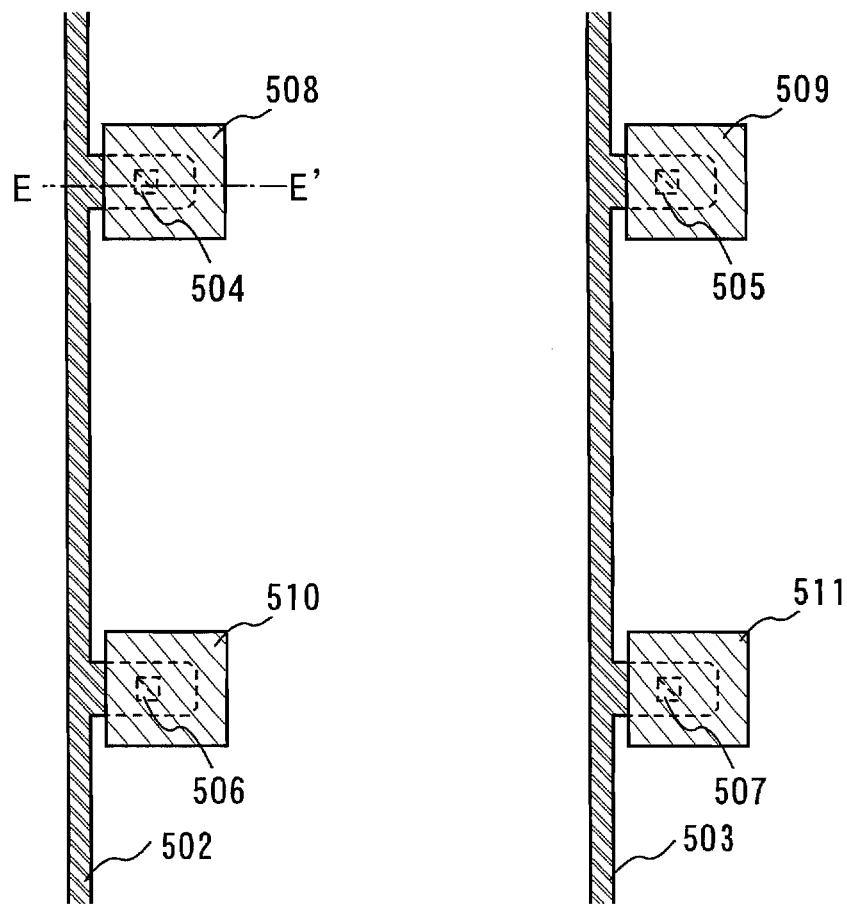
FIGS. 5A and 5B are diagrams showing a manufacturing step of a TFT of the present invention.
Figure 5B:
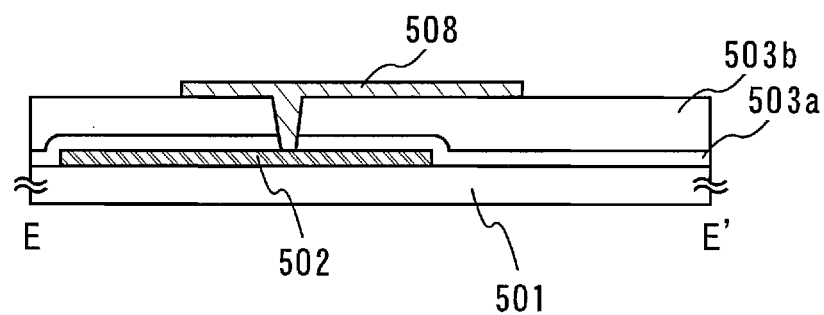

At first, as shown in FIGS. 5A and 5B, a first conductive film is formed on a substrate 501 having an insulating surface. Then patterning and etching are performed, thereby forming source lines 502 and 503. Here, a glass substrate is used for the substrate 501 and a tungsten silicide (W—Si) film is used for source lines 502 and 503.

Subsequently, insulating films 503a and 503b for covering the source lines 502 and 503 are formed. Here, a silicon oxide film formed by plasma-CVD and an silicon oxide film formed by low pressure thermal CVD are laminated.

In addition, after forming the insulating film 503b, the surface of the insulating film may be planarized by process of chemical grinding and mechanical grinding (typically, CMP technique). For example the planarization is performed so that the maximum height of the surface of the insulating film (R max) is to be equal to or less than 0.5 μm, preferably, equal to or less than 0.3 μm.

Subsequently, a resist mask is formed on the insulating film 503b, and contact holes 504 to 507 reaching the source line 502 are formed. After this, the mask is removed.

Subsequently, the second conductive film is formed, and a resist mask is formed on the conductive film by known photolithography. After this, by a known method such as dry etching or wet etching, the second conductive film is etched, and source electrodes 508 to 511, which are the first electrodes are formed. Here, a source electrode formed of a tungsten film is formed by sputtering.

Figure 6A:
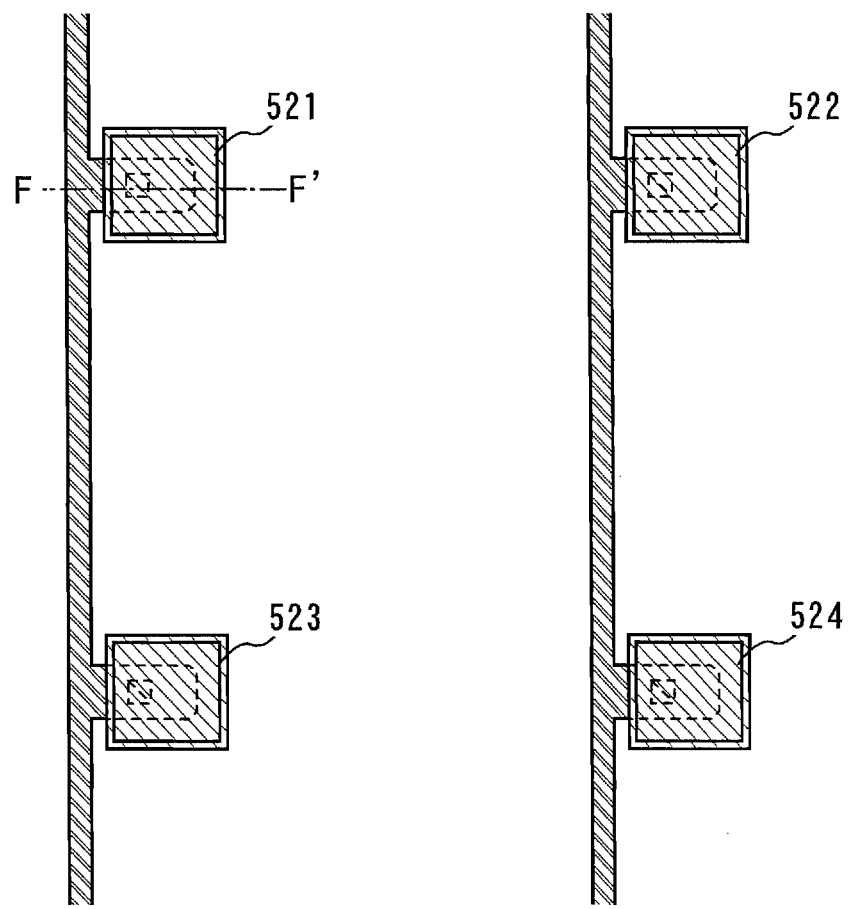
FIGS. 6A and 6B are diagrams showing a manufacturing step of a TFT of the present invention.
Figure 6B:
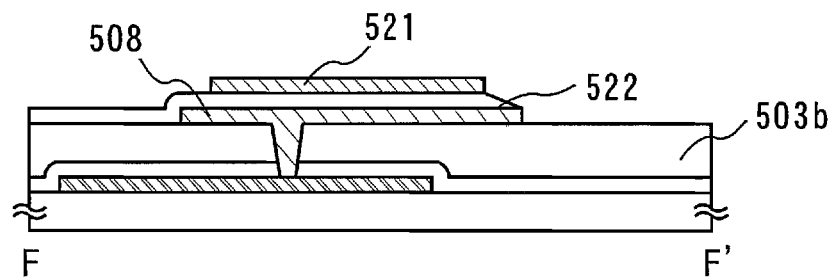

Next, as shown in FIGS. 6A and 6B, a silicon oxide film is formed with a film thickness of 50 nm on source electrodes 508 to 511 and the insulating film 503b by low pressure thermal CVD. After forming the silicon oxide film, a third conductive film is formed.

After a resist mask is formed on the third conductive film by known photolithography, drain electrodes 521 to 524, which are the second electrode are formed by dry etching. Here, as the third conductive film (second electrode), a tungsten film is layered by sputtering.

Next, a resist mask is formed on a drain electrode, a silicon oxide film is etched by dry etching (522), and a part of the source electrodes 508 to 511 which are covered with the third insulating film is exposed. Etching at this time is finished in the boundary section where source electrodes 508 to 511 are exposed. In addition, the silicon oxide film may be removed and the source electrodes 508 to 511 may be over etched in order to make the exposed portion of the source electrodes 508 to 511 uniform.

Figure 7A:
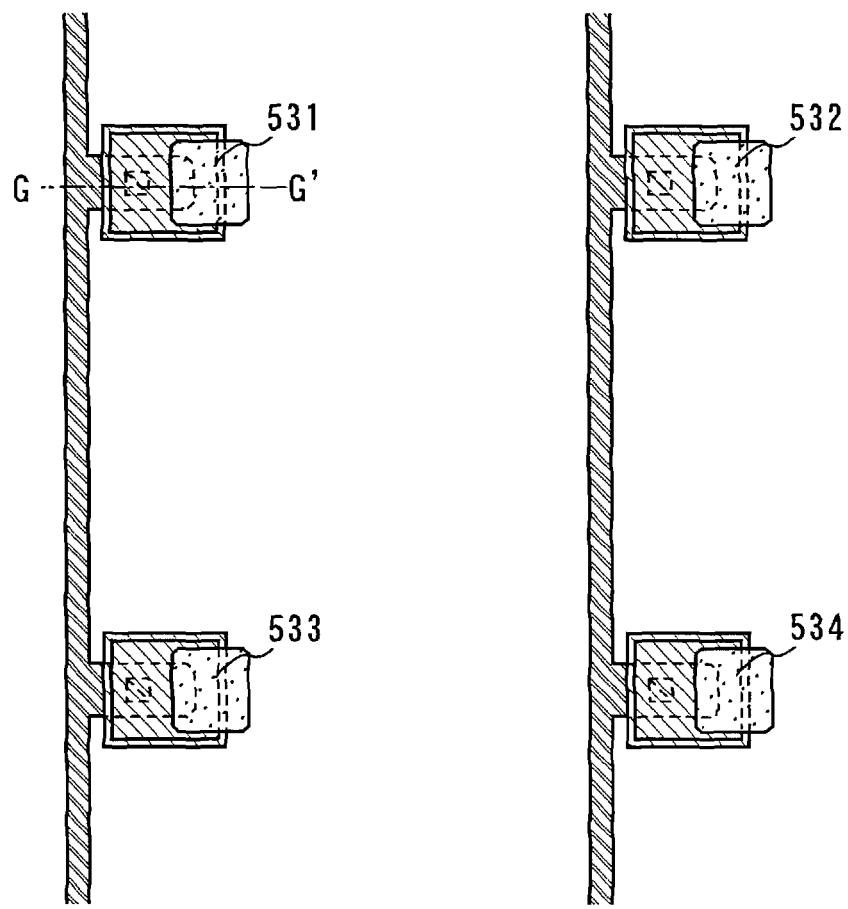
FIGS. 7A and 7B are diagrams showing a manufacturing step of a TFT of the present invention.
Figure 7B:
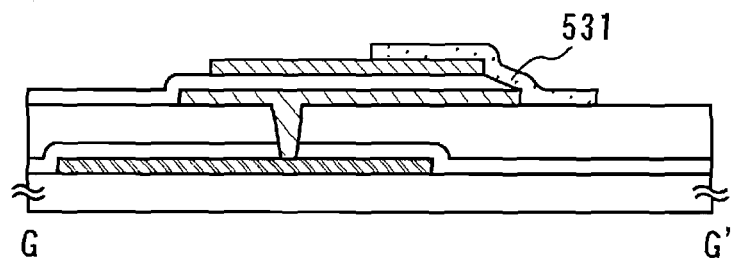

Next, as shown in FIGS. 7A and 7B, a surface of the substrate is washed, and pretreatment such as UV cleaning is sufficiently performed, thereby forming semiconductor films 531 to 534. Here, in a vapor deposition device, pentacene that is an organic semiconductor material is formed by using a meal mask at the side surface of the lamination layer comprising the first electrode, the third insulating film and the second electrode and the side surface of the lamination layer where the first electrode is exposed to.

Figure 8A:
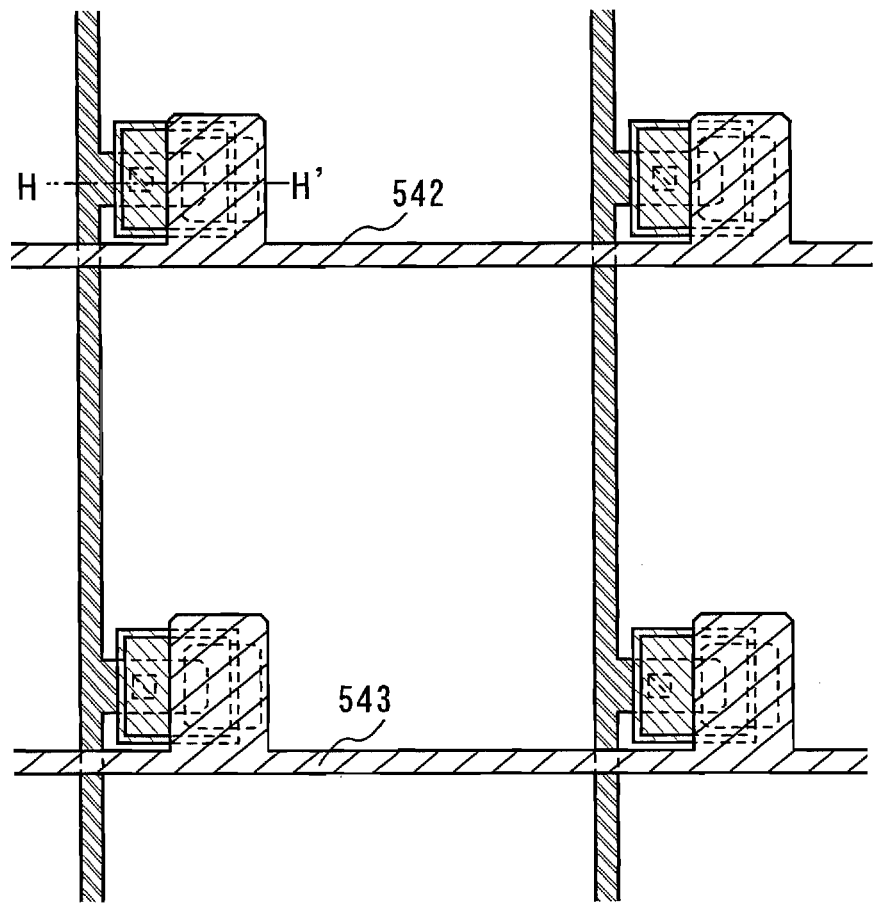
FIGS. 8A and 8B are diagrams showing a manufacturing step of a TFT of the present invention.
Figure 8B:
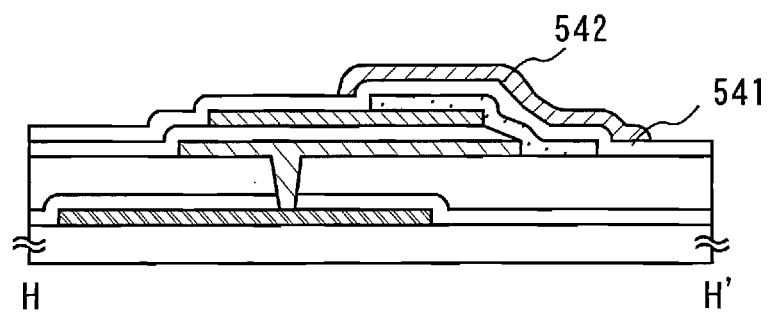

As shown in FIGS. 8A and 8B, after a fourth insulating film corresponding to a gate insulating film 541 is formed over the entire surface of the substrate, the third conductive film corresponding to gate electrodes 542 and 543 are formed. Here, polyvinyl alcohol (PVA) is applied by a spinner in aversion ambient atmosphere so as to form a gate insulating film. Then, poly (3,4-ethylene dioxythiophene) (PEDOT) is dropped by ink-jetting so as to form a gate electrode. When the gate electrode is formed, it is layered so as to at least cover the part of the semiconductor film contacting with the third insulating film.

Figure 9A:
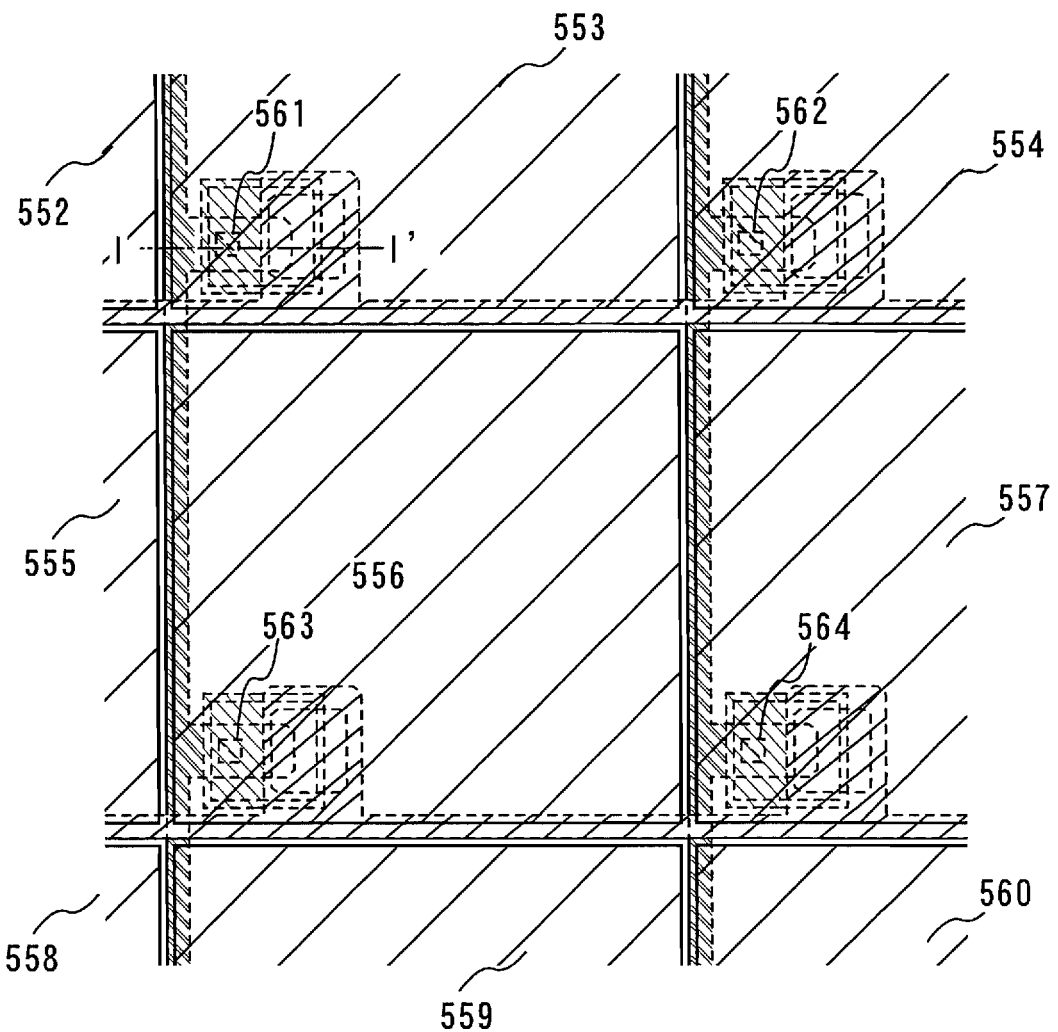
FIGS. 9A and 9B are diagrams showing a manufacturing step of a TFT of the present invention.
Figure 9B:
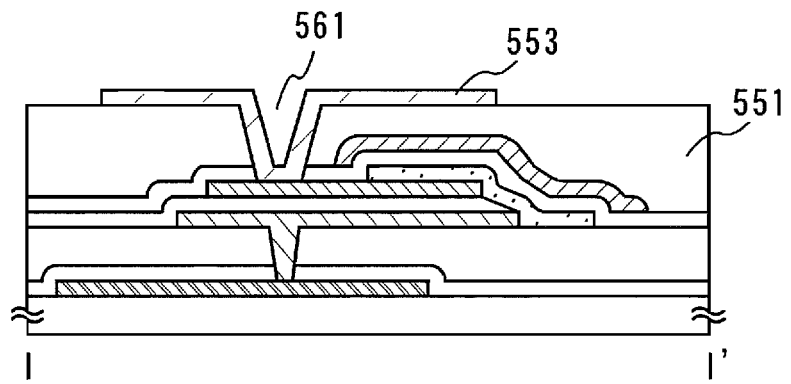
Figure 10:
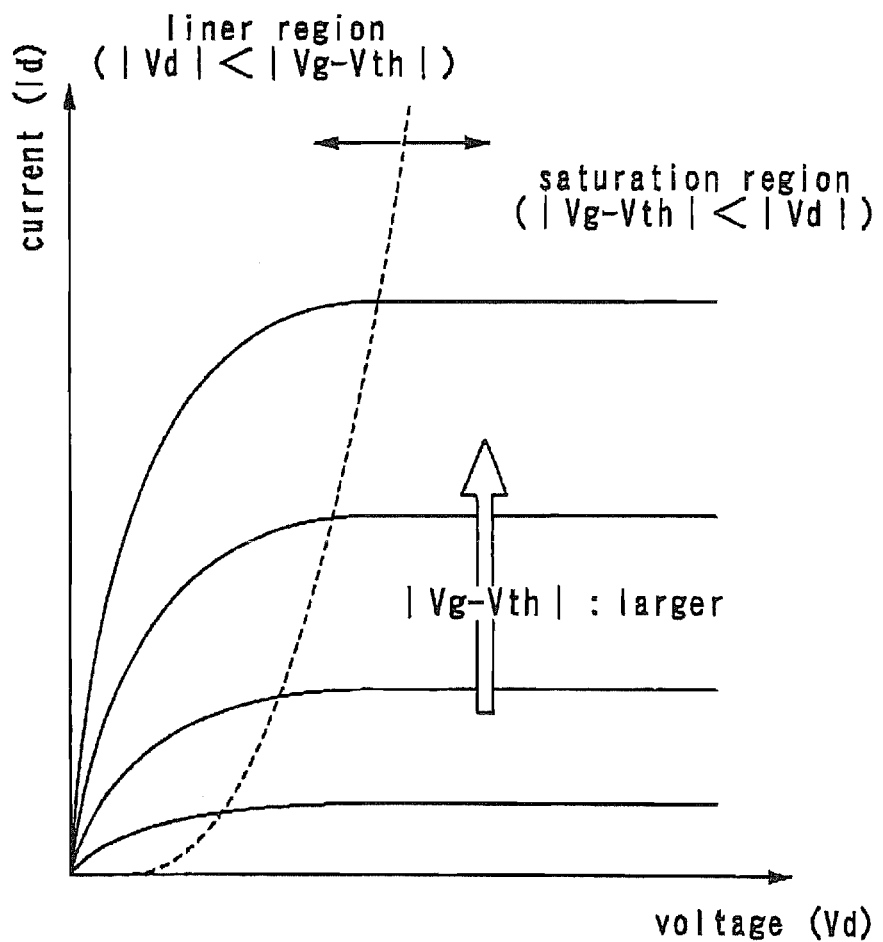
FIG. 10 is a diagram showing a current-voltage characteristic of a TFT.

As shown in FIGS. 9A and 9B, a fifth insulating film 551 is formed on the entire surface of the substrate. Here, the fifth insulating film is formed after applying acrylic resin and performing prebake.

Next, contact holes 561 to 564 which connect with the second electrode (drain electrode) are formed by etching the fifth insulating film. Here, a resist mask is formed, and the fifth insulating film is etched by dry etching, thereby forming the contact holes. Next, after forming a transparent conductive film, here, an indium tin oxide (ITO) film, patterning is performed thereto so as to form pixel electrodes 552 to 560.

An active matrix substrate of a liquid crystal display device according to the present invention can be formed by using the above steps. In this embodiment, an example of manufacturing the active matrix substrate for a transmissive display device by using a transparent conductive film for a pixel electrode is described. However, a material film having reflectivity may be used for the pixel electrode, and the active matrix substrate of reflective display device may be manufactured. In addition, only a manufacturing step of a pixel portion is described, but the present invention can be applied to a TFT constituting a drive circuit. Accordingly, a pixel portion and a drive circuit may be formed on the same substrate at the same time according to the present invention.

In addition, a manufacturing step of the present invention can be applied to the active matrix substrate of other display devices (EL display device, field emission display device, cataphoresis display device). Even more particularly, a manufacturing steps of the present invention can be applied to that of an IC tip formed of TFTs, an external drive circuit formed of namely TFTs, a memory, and the like.

Even more particularly, a structure of Embodiment Mode 1 is applied to the structure of a TFT in the present embodiment. However, other structures such as described in Embodiment Modes 2 to 7 may be applied.

This application is based on Japanese Patent Application serial no. 2003-076640 filed in Japan Patent Office on Mar. 19, 2003, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A semiconductor device comprising:
a first conductive film;
a second conductive film over the first conductive film;
a first insulating film interposed between the first conductive film and the second conductive film;
a semiconductor film over the first conductive film;
a third conductive film over the semiconductor film; and
a second insulating film interposed between the semiconductor film and the third conductive film,
wherein a whole of the semiconductor film overlaps with the first conductive film,
wherein a whole of the semiconductor film overlaps with the third conductive film,
wherein the first conductive film is one of a source electrode and a drain electrode,
wherein the second conductive film is the other of the source electrode and the drain electrode,
wherein the third conductive film is a gate electrode, and
wherein the semiconductor film is electrically connected to the first conductive film and the second conductive film.

2. The semiconductor device according to claim 1, wherein the semiconductor film has an opening.

3. The semiconductor device according to claim 1, wherein the third conductive film has an opening.

4. The semiconductor device according to claim 1, wherein the semiconductor film is interposed between the first insulating film and the second insulating film.

5. The semiconductor device according to claim 1, wherein the semiconductor film comprises one of silicon and an organic material.

6. A semiconductor device comprising:
a first conductive film;
a second conductive film over the first conductive film;
a first insulating film interposed between the first conductive film and the second conductive film;
a semiconductor film over the first conductive film;
a third conductive film over the semiconductor film; and
a second insulating film interposed between the semiconductor film and the third conductive film,
wherein a whole of the semiconductor film overlaps with the third conductive film,
wherein the first conductive film is one of a source electrode and a drain electrode,
wherein the second conductive film is the other of the source electrode and the drain electrode,
wherein the third conductive film is a gate electrode, and
wherein the semiconductor film is electrically connected to the first conductive film and the second conductive film.

7. The semiconductor device according to claim 6, wherein the semiconductor film is in contact with a side surface of the first conductive film and a top surface of the first conductive film, and
wherein an angle between the side surface and a bottom surface of the first conductive film is different from an angle between the top surface and the bottom surface.

8. The semiconductor device according to claim 6, wherein the second insulating film is in contact with a side surface of the first conductive film.

9. The semiconductor device according to claim 6, wherein the semiconductor film is interposed between the first insulating film and the second insulating film.

10. The semiconductor device according to claim 6, wherein the semiconductor film comprises one of silicon and an organic material.

11. A semiconductor device comprising:
a first conductive film;
a second conductive film over the first conductive film;
a first insulating film interposed between the first conductive film and the second conductive film;
a semiconductor film over the first conductive film;
a third conductive film over the semiconductor film;
a second insulating film interposed between the semiconductor film and the third conductive film;

a third insulating film over the third conductive film; and
a fourth conductive film over the third insulating film, the fourth conductive film electrically connected to the first conductive film through an opening of the third insulating film,
wherein a whole of the semiconductor film overlaps with the third conductive film,
wherein the first conductive film is one of a source electrode and a drain electrode,
wherein the second conductive film is the other of the source electrode and the drain electrode,
wherein the third conductive film is a gate electrode, and
wherein the semiconductor film is electrically connected to the first conductive film and the second conductive film.

12. The semiconductor device according to claim 11,
wherein the semiconductor film is in contact with a side surface of the first conductive film and a top surface of the first conductive film, and
wherein an angle between the side surface and a bottom surface of the first conductive film is different from an angle between the top surface and the bottom surface.

13. The semiconductor device according to claim 11, wherein the second insulating film is in contact with a side surface of the first conductive film.

14. The semiconductor device according to claim 11, wherein the semiconductor film is interposed between the first insulating film and the second insulating film.

15. The semiconductor device according to claim 11, wherein the semiconductor film comprises one of silicon and an organic material.

16. The semiconductor device according to claim 11, wherein the fourth conductive film is a pixel electrode.

17. A semiconductor device comprising:
a first conductive film;
a second conductive film over the first conductive film;
a first insulating film interposed between the first conductive film and the second conductive film;
a semiconductor film over the first conductive film;
a third conductive film over the semiconductor film;
a second insulating film interposed between the semiconductor film and the third conductive film,
a third insulating film over the third conductive film; and
a fourth conductive film over the third insulating film, the fourth conductive film electrically connected to the second conductive film through an opening of the third insulating film,
wherein a whole of the semiconductor film overlaps with the third conductive film,
wherein the first conductive film is one of a source electrode and a drain electrode,
wherein the second conductive film is the other of the source electrode and the drain electrode,
wherein the third conductive film is a gate electrode, and
wherein the semiconductor film is electrically connected to the first conductive film and the second conductive film.

18. The semiconductor device according to claim 17,
wherein the semiconductor film is in contact with a side surface of the first conductive film and a top surface of the first conductive film, and
wherein an angle between the side surface and a bottom surface of the first conductive film is different from an angle between the top surface and the bottom surface.

19. The semiconductor device according to claim 17, wherein the second insulating film is in contact with a side surface of the first conductive film.

20. The semiconductor device according to claim 17, wherein the semiconductor film is interposed between the first insulating film and the second insulating film.

21. The semiconductor device according to claim 17, wherein the semiconductor film comprises one of silicon and an organic material.

22. The semiconductor device according to claim 17, wherein the fourth conductive film is a pixel electrode.

* * * * *